United States Patent
Chun

(10) Patent No.: US 7,263,014 B2
(45) Date of Patent: Aug. 28, 2007

(54) SEMICONDUCTOR MEMORY DEVICE HAVING N-BIT PREFETCH TYPE AND METHOD OF TRANSFERRING DATA THEREOF

(75) Inventor: Jun Hyun Chun, Cheongju-si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 142 days.

(21) Appl. No.: 11/148,231

(22) Filed: Jun. 9, 2005

(65) Prior Publication Data

US 2006/0171218 A1    Aug. 3, 2006

(30) Foreign Application Priority Data

Jan. 28, 2005    (KR) .................. 10-2005-0008134

(51) Int. Cl.
*G11C 7/12* (2006.01)
*G11C 7/10* (2006.01)
*G11C 7/22* (2006.01)
*G11C 11/4096* (2006.01)
*G11C 11/409* (2006.01)

(52) U.S. Cl. .............. 365/203; 365/204; 365/149; 365/239; 365/189.05

(58) Field of Classification Search .......... 365/185.25, 365/189.02, 189.05, 230.03, 149, 203, 204, 365/233, 239
See application file for complete search history.

(56) References Cited

U.S. PATENT DOCUMENTS

| | | | |
|---|---|---|---|
| 5,594,704 A | | 1/1997 | Konishi et al. |
| 5,608,688 A | | 3/1997 | Park |
| 6,144,602 A | * | 11/2000 | Uzawa ................. 365/203 |
| 6,163,493 A | | 12/2000 | Yamagata et al. |
| 6,201,760 B1 | * | 3/2001 | Yun et al. ............... 365/233 |
| 6,243,312 B1 | | 6/2001 | Kim |
| 6,269,029 B1 | * | 7/2001 | Suh .................. 365/189.06 |
| 6,275,430 B1 | * | 8/2001 | Ka ..................... 365/203 |
| 6,449,198 B1 | | 9/2002 | Hamade et al. |
| 6,657,908 B2 | | 12/2003 | Yoon et al. |
| 6,765,833 B2 | | 7/2004 | Khang |
| 2001/0021135 A1 | * | 9/2001 | Yoon et al. ............. 365/203 |

(Continued)

FOREIGN PATENT DOCUMENTS

JP    07-169263    7/1995

(Continued)

*Primary Examiner*—J. H. Hur
(74) *Attorney, Agent, or Firm*—Lowe Hauptman & Berner LLP

(57) ABSTRACT

A semiconductor memory device in which only global I/O buses, which receive one or more data groups that must be output first among a N number of data groups that are prefetched in a N-bit prefetch type, from an array of memory cells are precharged with a ½ power supply voltage, thereby making the output speed of the data groups that must be output first thing faster than that of the remaining data groups. The semiconductor memory device includes a data bus controller for precharging predetermined data buses that receive one or more data group that must be output to the outside first among a N number of data groups that are prefetched in a N-bit prefetch type from an array of memory cells, using information to decide an I/O sequence of the N number of the data groups.

23 Claims, 5 Drawing Sheets

U.S. PATENT DOCUMENTS

2004/0085841 A1  5/2004  Lim et al.
2004/0109366 A1  6/2004  Moon et al.
2004/0109373 A1  6/2004  Kim
2005/0117403 A1* 6/2005  Fujisawa ............... 365/189.05

FOREIGN PATENT DOCUMENTS

| | | |
|---|---|---|
| JP | 8111093 | 4/1996 |
| JP | 2001-013669 | 1/2001 |
| KR | 100224775 | 7/1999 |
| KR | 1020020034216 | 5/2002 |
| KR | 1020030002235 | 1/2003 |

* cited by examiner

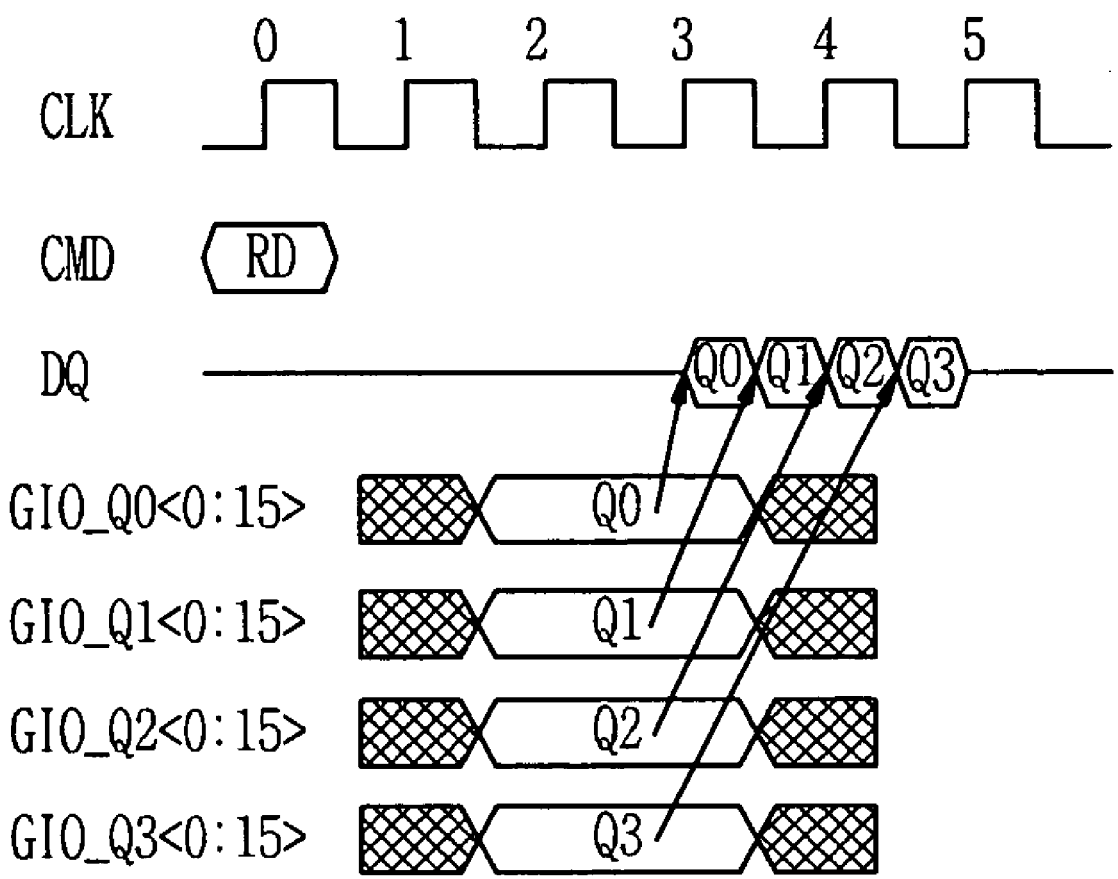

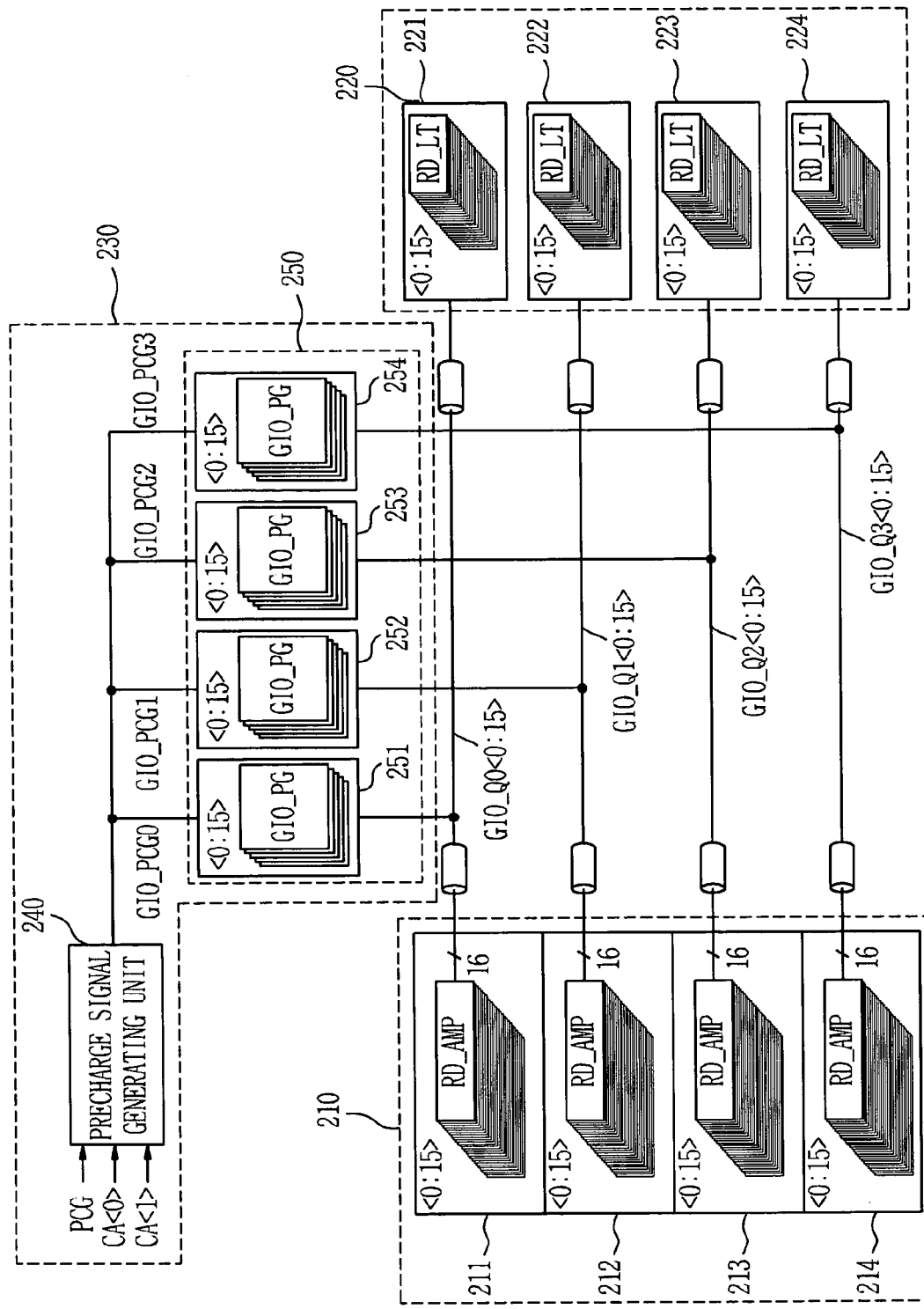

| BURST LENGTH | COLUMN ADDRESS (CA<2,CA<1>,CA<0>) | SEQUENTIAL ADDRESSING MODE | INTERLEAVE ADDRESSING MODE |
|---|---|---|---|
| 4 | 0 0 0 | 0,1,2,3 | 0,1,2,3 |
| | 0 0 1 | 1,2,3,0 | 1,0,3,2 |
| | 0 1 0 | 2,3,0,1 | 2,3,0,1 |
| | 0 1 1 | 3,0,1,2 | 3,2,1,0 |
| 8 | 0 0 0 | 0,1,2,3,4,5,6,7 | 0,1,2,3,4,5,6,7 |
| | 0 0 1 | 1,2,3,0,5,6,7,4 | 1,0,3,2,5,4,7,6 |
| | 0 1 0 | 2,3,0,1,6,7,4,5 | 2,3,0,1,6,7,4,5 |
| | 0 1 1 | 3,0,1,2,7,4,5,6 | 3,2,1,0,7,6,5,4 |
| | 1 0 0 | 0,1,2,3,0,1,2,3 | 0,1,2,3,0,1,2,3 |
| | 1 0 1 | 1,2,3,0,1,2,3,0 | 1,0,3,2,1,0,3,2 |
| | 1 1 0 | 2,3,0,1,2,3,0,1 | 2,3,0,1,2,3,0,1 |
| | 1 1 1 | 3,0,1,2,3,0,1,2 | 3,2,1,0,3,2,1,0 |

SEMICONDUCTOR MEMORY DEVICE HAVING N-BIT PREFETCH TYPE AND METHOD OF TRANSFERRING DATA THEREOF

BACKGROUND

1. Field of the Invention

The present invention relates to a semiconductor memory device and method of transferring data thereof. More specifically, the present invention relates to a semiconductor memory device and method of transferring data thereof, wherein at least one data group, which have to be output first thing, among a N number of data groups that are prefetched from a memory cells array in a N-bit prefetch type, are transferred to the outside faster than the remaining groups.

2. Discussion of Related Art

Generally, a data I/O operation of a synchronous semiconductor memory device is executed in synchronism with an internal clock signal that is generated based on an external clock signal. This type of synchronous semiconductor memory device may include SDR (Single Data Rate) SDRAM (Synchronous Dynamic Random Access Memory), DDR (Double Data Rate) SDRAM, DDR2 SDRAM and DDR3 SDRAM, and the like. In the SDR SDRAM, 1-bit data are prefetched from memory cells, and then output to a DQ (input/output) pad every clock cycle. In the DDR SDRAM, 2-bit data are prefetched from memory cells, and then output to a DQ pad on a clock cycle basis. In the DDR2 SDRAM, 4-bit data are prefetched from memory cells, and then output to a DQ pad on a clock cycle basis. In the DDR3 SDRAM, 8-bit data are prefetched from memory cells, and then output to a DQ pad on a clock cycle basis. Therefore, data processing speed of the DDR2 SDRAM device is faster than that of the DDR SDRAM device, and the data processing speed of DDR3 SDRAM device is faster than that of the DDR2 SDRAM device.

Of them, the DDR2 SDRAM generally uses a 4-bit prefetch scheme. In the 4-bit prefetch scheme, four data groups are prefetched from memory cells in a parallel way based on one read command, and the prefetched four data groups are output through the same DQ pad during 2 clock cycles. In this above example, the number of the data groups is determined according to a data width. For example, if the data width is ×16 and the SDRAM has a 4-bit prefetch scheme, four data groups Q0, Q1, Q2 and Q3 each consisting of sixteen data bits are output from the memory cells to the outside through the DQ pad, as shown in FIG. 1.

FIG. 1 is a timing diagram showing that data read from memory cells in a read operation of a semiconductor memory device are output to the DQ pad through data amplifiers, global I/O buses GIO_Q0<0:15>, GIO_Q1<0:15>, GIO_Q2<0:15> and GIO_Q3<0:15>, and read latch circuits, read multiplexers, and read drivers. At this time, the aforementioned data amplifiers, the read latch circuits, the read multiplexers, and the read drivers are used for a data output path, and are generally well known to those skilled in the art. Thus, detailed description thereof will be omitted for simplicity.

In addition, FIG. 1 shows that the data width of the global I/O bus disposed between the data amplifiers and the read latch circuits is ×16, and the mode is the 4-bit prefetch type. Accordingly, four data groups Q0, Q1, Q2 and Q3 each consisting of sixteen data bits are loaded onto the global I/O buses GIO_Q0<0:15>, GIO_Q1<0:15>, GIO_Q2<0:15> and GIO_Q3<0:15> in which the data width is a total of 16×4=64 bits, respectively.

Furthermore, although not shown in FIG. 1, the read multiplexers output the four data groups Q0, Q1, Q2 and Q3 to the DQ pad in a serial way using lower 2-bit column addresses CA<0:1> in order of the output in accordance with specification defined in JEDEC.

That is, if the column addresses CA<0> and CA<1> are 00, the data groups are output in order of Q0, Q1, Q2 and Q3. If the column addresses CA<0> and CA<1> are 01, the data groups are output in order of Q1, Q2, Q3 and Q0. If the column addresses CA<0> and CA<1> are 10, the data groups are output in order of Q2, Q3, Q0 and Q1. If the column addresses CA<0> and CA<1> are 11, the data groups are output in order of Q3, Q0, Q1 and Q2.

As described above, when a read command RD is input, the output sequence of four data groups that are prefetched in the 4-bit prefetch type is previously determined according to the column addresses CA<0:1>. Technology for improving the output speed of data groups, however, has not yet been developed.

SUMMARY OF THE INVENTION

Accordingly, the present invention has been made in view of the above problems, and it is an object of the present invention to cause the output speed of a data group that must be output first to be faster than that of the remaining data groups in such a way that only global I/O buses that receive and transmit one or more data groups, which have to be output to the outside first thing, among data groups that are prefetched in a N-bit prefetch type are precharged with a ½ power supply voltage.

To achieve the above object, according to an embodiment of the present invention, there is provided a semiconductor memory device using a N-bit prefetch type, including an array of memory cells, a plurality of data buses which receives a N number of data groups that are prefetched in the N-bit prefetch type from the array in a parallel way, and transmits the data groups to the outside, and a data bus controller for precharging predetermined data buses that receive one or more data groups, which must be output to the outside first, among the N number of the data groups in accordance with I/O sequence information of the N number of the predetermined data groups, wherein after the predetermined data buses are precharged, the one or more data groups that must be output to the outside first thing are transmitted to the outside faster by a given time than the remaining data groups.

According to another embodiment of the present invention, there is provided a semiconductor memory device using a N-bit prefetch type, including an array of memory cells, an amplifier unit that amplifies a N number of data groups that are prefetched in the N-bit prefetch type, which are received from the array, a plurality of data buses that receives the N number of the data groups from the amplifier unit in a parallel way, a latch unit that latches the N number of the data groups that are received from the plurality of the data buses, and a data bus controller for precharging predetermined data buses that receive one or more data groups, which must be output to the outside first, among the N number of the data groups in accordance with I/O sequence information of the N number of the predetermined data groups, wherein after the predetermined data buses are precharged, the one or more data groups that must be output to the outside first are received from the amplifier unit, and then transmitted to the outside faster by a given time than the remaining data groups.

According to another embodiment of the present invention, there is provided a method of transmitting data of a semiconductor memory device including an array of memory cells, including the steps of precharging predetermined data buses, which transmit one or more data groups that must be output to the outside first among a N number of data groups that are prefetched in a N-bit prefetch type, among a plurality of data buses that receives the N number of the data groups from the array and transmits the received data groups to the outside, in accordance with I/O sequence information of the N number of the predetermined data groups, and after the predetermined data buses are precharged, transmitting the one or more data groups that must be output to the outside thing to the outside faster than the remaining data groups.

BRIEF DESCRIPTION OF THE DRAWINGS

FIG. 1 is a timing diagram showing four data groups that are prefetched in a 4-bit prefetch type in the prior art;

FIG. 2 is a block diagram of a semiconductor memory device for improving the output speed of data groups that are prefetched in the 4-bit prefetch type according to an embodiment of the present invention;

DETAILED DESCRIPTION OF PREFERRED EMBODIMENTS

Figure 3A:
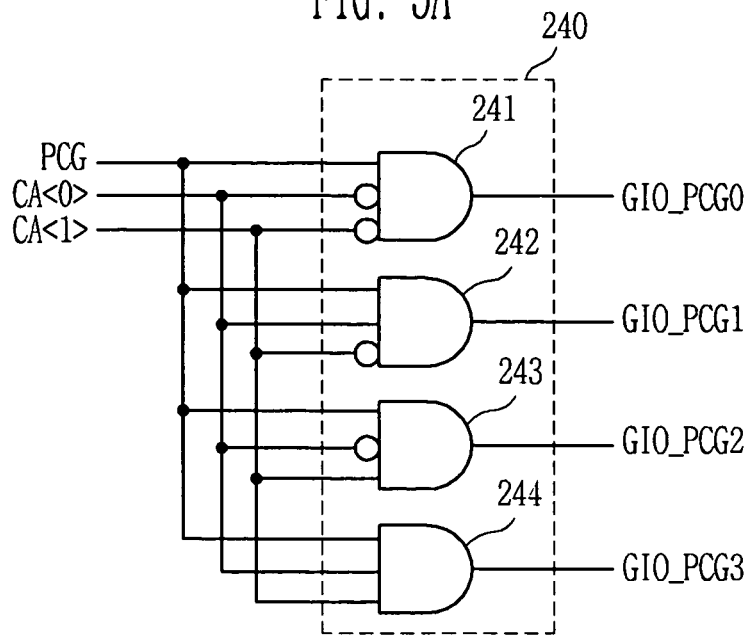
FIG. 3A is a circuit diagram showing an embodiment of the precharge signal generating unit of FIG. 2.

Embodiments according to the present invention will now be described with reference to the accompanying drawings. Since the embodiments are provided so that a person of ordinary skill in the art will be able to understand the present invention, they may be modified in various manners and the scope of the present invention is not limited by the embodiments described herein.

FIG. 2 is a block diagram of a semiconductor memory device for improving the output speed of data groups that are prefetched in the 4-bit prefetch type according to an embodiment of the present invention.

Referring to FIG. 2, the semiconductor memory device includes a data amplifier unit 210, a read latch unit 220, and a global I/O bus control unit 230. The global I/O bus control unit 230 includes a precharge signal generating unit 240 and a precharge unit 250.

The present invention includes the global I/O bus control unit 230 having the precharge signal generating unit 240 and the precharge unit 250 unlike the prior art. The global I/O bus control unit 230 is provided to enhance the output speed of one or more data groups that must be output first thing among data groups that are prefetched in the 4-bit prefetch type.

FIG. 2 shows a DDR2 SDRAM having the 4-bit prefetch type, wherein the data width is ×16. Accordingly, the whole data width is 16×4=64 bits. Since the mode is the 4-bit prefetch type, however, data output from memory cells (not shown) are output as four data groups on a 16-bit basis.

Referring to FIG. 2, the global I/O bus control unit 230 includes the precharge signal generating unit 240 and the precharge unit 250. The precharge signal generating unit 240 uses a precharge signal PCG having a predetermined pulse width and column addresses CA<0> and CA<1> to generate global I/O bus precharge signals GIO_PCG0, GIO_PCG1, GIO_PCG2 and GIO_PCG3. At this time, the column addresses CA<0> and CA<1> are used to decide the output sequence of the data groups that are prefetched in the 4-bit prefetch type.

The precharge unit 250 includes four unit precharge units 251 to 254, as shown in FIG. 2. Each of the four unit precharge units 251 to 254 has sixteen unit precharge units GIO_PG<0:15>. The four unit precharge units 251 to 254 precharge only a global I/O bus, which transmits/receives one or more data groups that must be output first, among the global I/O buses GIO_Q0<0:15>, GIO_Q1<0:15>, GIO_Q2<0:15> and GIO_Q2<0:15> with a ½ power supply voltage VDD in response to the global I/O bus precharge signals GIO_PCG0, GIO_PCG1, GIO_PCG2 and GIO_PCG3, respectively.

As shown in FIG. 2, since the mode is the 4-bit prefetch type, the four global I/O buses GIO_Q0<0:15>, GIO_Q1<0:15>, GIO_Q2<0:15> and GIO_Q2<0:15> are provided. Each of the global I/O buses GIO_Q0<0:15>, GIO_Q1<0:15>, GIO_Q2<0:15> and GIO_Q2<0:1 5> is composed of the sixteen global I/O lines.

The data amplifier unit 210 includes four read amplifiers 211 to 214. Each of the read amplifiers 211 to 214 includes sixteen read amplifiers RD_AMP<0:15>. The read amplifiers 211 to 214 amplify four data groups Q0, Q1, Q2 and Q3 read from memory cells in a read operation, and transfer the amplified four data groups to read latch circuits 221 to 224 through the global I/O buses GIO_Q0<0:15>, GIO_Q1<0:15>, GIO_Q2<0:15> and GIO_Q2<0:15>.

The read latch unit 220 includes the four read latch circuits 221 to 224. Each of the read latch circuits 221 to 224 is composed of sixteen read latch circuits RD_LT<0:15>. The read latch circuits 221 to 224 latch the data groups Q0, Q1, Q2 and Q3, which are loaded onto the global I/O buses GIO_Q0<0:15>, GIO_Q1<0:15>, GIO_Q2<0:15> and GIO_Q2<0:15>, respectively, and then output the latched data groups.

FIG. 3a is a circuit diagram showing an embodiment of the precharge signal generating unit 240 of FIG. 2.

The precharge signal generating unit 240 includes four AND gates 241 to 244. The AND gate 241 performs an AND operation on the precharge signal PCG having a predetermined pulse width and inverted signals of the column addresses CA<0:1> to generate the global I/O bus precharge signal GIO_PCG0. The AND gate 242 performs an AND operation on the precharge signal PCG having a predetermined pulse width, the column address CA<0>, and the inverted signal of the column address CA<1> to generate the global I/O bus precharge signal GIO_PCG1. The AND gate 243 performs an AND operation on the precharge signal PCG, the inverted signal of the column address CA<0>, and the column address CA<1> to generate the global I/O bus precharge signal GIO_PCG2. The AND gate 244 performs an AND operation on the precharge signal PCG, and the column addresses CA<0:1> to generate the global I/O bus precharge signal GIO_PCG3. The global I/O bus precharge signals GIO_PCG0 to GIO_PCG3 are generated according to logic values of the column addresses CA<0:1>, i.e., 00, 10, 01 and 11. That is, if the column addresses CA<0:1> are 00, the signal GIO_PCG0 is generated. If the column addresses CA<0:1> are 10, the signal GIO_PCG1 is generated. If the column addresses CA<0:1> are 01, the signal GIO_PCG2 is generated. If the column addresses CA<0:1> are 11, the signal GIO_PCG3 is generated.

Figure 3B:
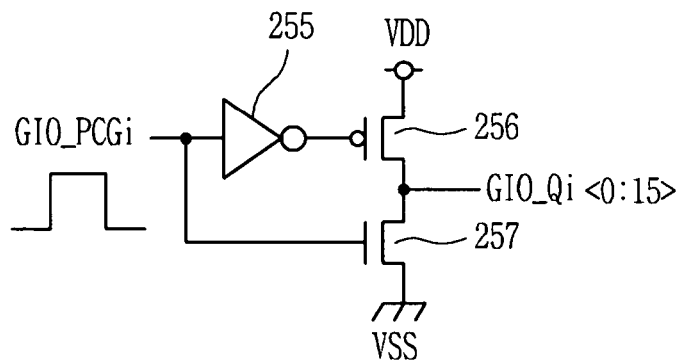
FIG. 3B is a circuit diagram showing an embodiment of the precharge unit of FIG. 2.

FIG. 3B shows one of the unit precharge units GIO_PG<0:15> that are included in each of the unit precharge units 251 to 254 of FIG. 2.

One unit precharge unit GIO_PCG<i> includes an inverter 225, a PMOS transistor 226, and a NMOS transistor 227. The inverter 225 inverts the global I/O bus precharge signal GIO_PCGi, and outputs the inverted signal to the PMOS transistor 256. The PMOS transistor 256 and the NMOS transistor 257 are connected between a power supply voltage VDD and a ground voltage VSS, and each have a gate to which the global I/O bus precharge signal GIO_PCGi is input. The PMOS transistor 256 and the NMOS transistor 257 are turned on at the same time if the global I/O bus precharge signal GIO_PCGi is input as a high pulse, and thus precharge only predetermined global I/O buses GIO_Qi0<0:15>, which transmit/receive one or more data groups that must be output first, among the global I/O buses GIO_Q0<0:15>, GIO_Q1<0:15>, GIO_Q2<0:15> and GIO_Q2<0:15> with ½ VDD.

A method of precharging the global I/O buses will now be described with reference to FIGS. 3A and 3B.

If the column addresses CA<0:1> are 00, the global I/O bus precharge signal GIO_PCG0 is generated as a high pulse, and the global I/O buses GIO_Q0<0:15> is thus precharged with the ½ power supply voltage VDD. If the column addresses CA<0:1> are 10, the global I/O bus precharge signal GIO_PCG1 is generated as a high pulse, and the global I/O buses GIO_Q1<0:15> are thus precharged with ½ power supply voltage VDD. If the column addresses CA<0:1> are 01, the global I/O bus precharge signal GIO_PCG2 is generated as a high pulse, and the global I/O buses GIO_Q2<0:15> are thus precharged with ½ power supply voltage VDD. If the column addresses CA<0:1> are 11, the global I/O bus precharge signal GIO_PCG3 is generated as a high pulse, and the global I/O buses GIO_Q3<0:15> are thus precharged with ½ power supply voltage VDD.

Figure 4:
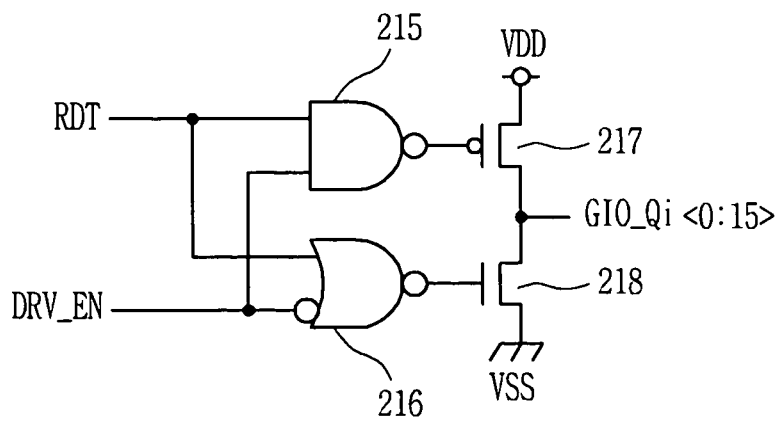
FIG. 4 is a circuit diagram showing an embodiment of the data amplifier of FIG. 2.

FIG. 4 shows one of the read amplifiers RD_AMP<0:15> included in each of the data amplifiers 211 to 214 of FIG. 2.

The read amplifier RD_AMP<i> includes a NAND gate 215, a NOR gate 216, a PMOS transistor 217 and a NMOS transistor 218. The NAND gate 215 performs a NAND operation on read data RDT and a driver enable signal DRV_EN, and outputs the result to the gate of the PMOS transistor 217. The NOR gate 216 performs a NOR operation on the read data RDT and an inverted signal of the driver enable signal DRV_EN, and outputs the result to the gate of the NMOS transistor 218. The PMOS transistor 217 and the NMOS transistor 218 are connected between a power supply voltage VDD and a ground voltage VSS, and have gates to which the output signal of the NAND gate 215 and the output signal of the NOR gate 216 are input, respectively.

For example, if the read data RDT is in a logic high and the driver enable signal DRV_EN is in a logic high, the PMOS transistor 217 is turned on, and the NMOS transistor 218 is turned off. Data of a logic high are thus output to the global I/O buses GIO_Q0<0:15>, GIO_Q1<0:15>, GIO_Q2<0:15> and GIO_Q2<0:15>. If the read data RDT is in a logic low and the driver enable signal DRV_EN is in a logic high, the PMOS transistor 217 is turned off, and the NMOS transistor 218 is turned on. Data of a logic low are thus output to the global I/O buses GIO_Q0<0:15>, GIO_Q1<0:15>, GIO_Q2<0:15> and GIO_Q2<0:15>.

As such, the read amplifier 211 transmits the data group Q0 of 16 bits (16 bits having a logic low or a logic high) to the global I/O buses GIO_Q0<0:15>. The read amplifier 212 transmits the 16-bit data group Q1 to the global I/O buses GIO_Q1<0:15>. The read amplifier 213 transmits the 16-bit data group Q2 to the global I/O buses GIO_Q2<0:15>. The read amplifier 214 transmits the 16-bit data group Q3 to the global I/O buses GIO_Q3<0:15>.

If a global I/O bus on which one or more data groups that have to be output first among the global I/O buses GIO_Q0<0:15>, GIO_Q1<0:15>, GIO_Q2<0:15> and GIO_Q2<0:15>, e.g., the global I/O buses GIO_Q0<0:15> is precharged with a ½ power supply voltage VDD, the data group Q0 is transmitted to the read latch circuits 221 to 224 faster than the remaining data groups Q1, Q2 and Q3.

Figures 5, 6:
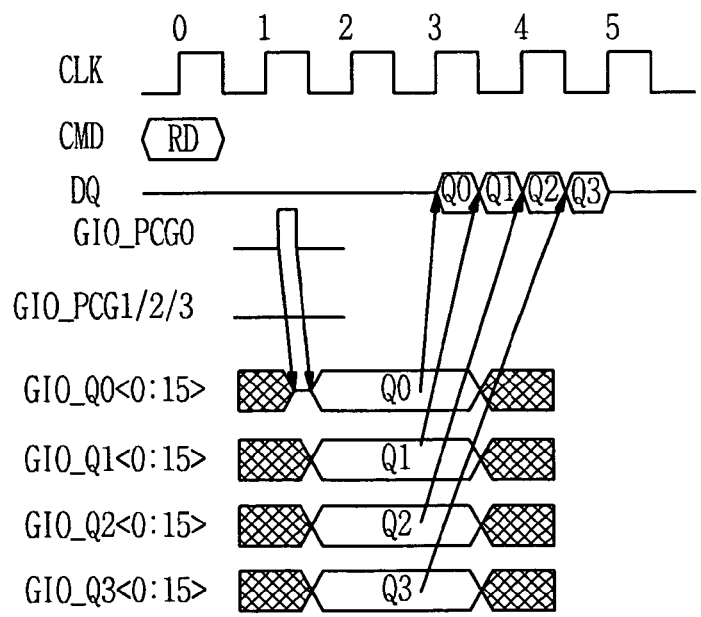
FIG. 5 is a table illustrating the data I/O sequence of DDR2 SDRAM, which is specified in JEDEC.
FIGS. 6 and 7 are timing diagrams showing that the output speed of data groups that must be output to the outside first thing among four data groups that are prefetched in the 4-bit prefetch type of FIG. 2 is improved.

Next, if the read latch circuits 221 to 224 latch the data groups Q0, Q1, Q2 and Q3, which are received through the global I/O buses GIO_Q0<0:15>, GIO_Q1<0:15>, GIO_Q2<0:15> and GIO_Q3<0:15>, and then output the data groups to read multiplexers (not shown), the read multiplexers output the four data groups Q1, Q1, Q2 and Q3 to the outside through the DQ pad using lower 2-bit column addresses CA<0> and CA<1> in accordance with the I/O sequence of DDR2 SDRAM, which is specified in JEDEC shown in FIG. 5.

That is, as shown in FIG. 5, in the case where the burst length is 4 and the mode is a sequential addressing mode, if the column addresses CA<0:1> are 00, data are output in order of Q0, Q1, Q2 and Q3. If the column addresses CA<0:1> are 01, data are output in order of Q1, Q2, Q3 and Q0. If the column addresses CA<0:1> are 10, data are output in order of Q2, Q3, Q0 and Q1. If the column addresses CA<0:1> are 11, data are output in order of Q3 Q0, Q1 and Q2.

Although a case where the burst length is 8 and an interleave addressing mode are illustrated in FIG. 5, reference can be made to the table of FIG. 5 for detailed description thereof.

FIG. 6 is a timing diagram showing data groups Q0, Q1, Q2 and Q3 loaded on the global I/O buses GIO_Q0<0:15>, GIO_Q1<0:15>, GIO_Q2<0:15> and GIO_Q3<0:15>, and data groups Q0, Q1, Q2 and Q3 output to the DQ pad in a read operation.

From FIG. 6, it can be seen that the column addresses CA<0:1> are 00, and a data group that must be output first is Q0 in view of the fact that only the global I/O buses GIO_Q0<0:15> are precharged with ½ power supply voltage VDD by the global I/O bus precharge signal GIO_PCG0.

At this time, the reason why the global I/O buses GIO_Q0<0:15> on which the data group that must be output first is loaded is precharged with ½ VDD is that the time when the data group becomes a logic high and a logic low is longer than that when being charged with ½ VDD if the global I/O buses GIO_Q0<0:15> are precharged with VDD. For this reason, the data group is precharged with ½ VDD.

Figure 7:
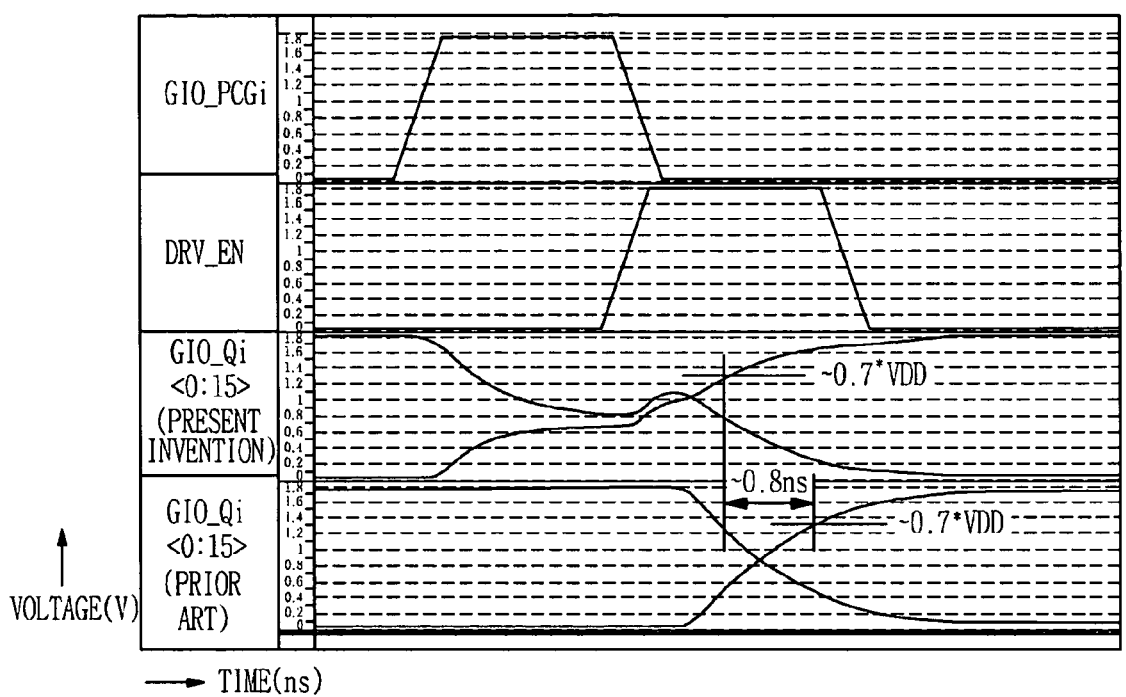

In FIG. 6, it has been described that the global I/O bus on which the data group that must be output first thing is loaded is GIO_Q0<0:15>. It is, however, to be noted that the global I/O bus can be GIO_Q1<0:15>, GIO_Q2<0:15> or GIO_Q3<0:15>. As such, if predetermined global I/O buses GIO_Qi<0:15> on which a data group that must be output first thing is loaded is precharged with ½ VDD, the predetermined global I/O buses GIO_Qi<0:15> become a logic high and a logic low 0.8 ns faster than the prior art, as shown in FIG. 7. If the predetermined global I/O bus is GIO_Q0<0: 15>, the first data group Q0 is transmitted to the read latch unit 220 faster than the remaining data groups Q1, Q2 and Q3.

As described above, in a global I/O bus of a semiconductor memory device, if the output speed of one or more data groups, which must be output to the outside first, among data groups prefetched in a N-bit prefetch type is set to be faster than that of the remaining data groups, the speed of tAA (Column command to data out) being the data output time can be improved. If the speed of tAA is improved, DDR2 or DDR3 SDRAM can operate even when a clock cycle tCK is small. For example, if tAA is 15 ns when CAS latency (CL) is 5, DDR2 or DDR3 SDRAM operates at 333 MHz since tCK is 3 ns. If tAA is 12.5 ns when CL is 5, DDR2 or DDR3 SDRAM operates at 400 MHz since tCK is 2.5 ns. Accordingly, it can be understood that the speed of tAA has to be necessarily improved for a high frequency operation.

Although the 4-bit prefetch type has been described, the present invention is not limited thereto, but can also be applied to a 8-bit prefetch type and other prefetch types.

As described above, according to the present invention, there is an advantage in that the speed of tAA can be improved by making the output speed of a data group that must be output to the outside first among data groups prefetched with N bits faster than that of the remaining data groups. As a result, semiconductor memory devices can operate at high speed although tCK is low.

Furthermore, by precharging only global I/O buses on which a data group that must be output first, the length of the global I/O buses becomes long. It is thus possible to prevent delay of a transmission time.

Although the foregoing description has been made with reference to the above embodiments, it is to be understood that changes and modifications of the present invention may be made by the ordinary skilled in the art without departing from the spirit and scope of the present invention and appended claims.

What is claimed is:

1. A semiconductor memory device using a N-bit (where, N is a natural number) prefetch type, comprising:
   an array of memory cells;
   a plurality of data buses which receives a N number of data groups that are prefetched in the N-bit prefetch type from the array in a parallel way, and transmits the data groups to the outside; and
   a data bus controller for precharging predetermined data buses that receive one or more data groups, which must be output to the outside first, among the N number of the data groups in accordance with I/O sequence information of the N number of the predetermined data groups,
   wherein after the predetermined data buses are precharged, the one or more data groups that must be output to the outside first are transmitted to the outside faster by a given time than the remaining data groups.

2. The semiconductor memory device as claimed in claim 1, wherein the data bus controller precharges the predetermined data buses, which receive the one or more data groups that must be output to the outside first, with a ½ power supply voltage.

3. The semiconductor memory device as claimed in claim 1, wherein the data bus controller comprises:
   a precharge signal generating unit that generates a N number of data bus precharge signals using a column address for deciding an I/O sequence of the N number of the predetermined data groups and a precharge signal having a given pulse width; and
   a precharge unit that precharges the predetermined data buses with a ½ power supply voltage in response to one of the N number of the data bus precharge signals.

4. The semiconductor memory device as claimed in claim 3, wherein the precharge unit includes a N number of unit precharge units that precharges the predetermined data buses with the ½ power supply voltage in response to one of the N number of the data bus precharge signals.

5. The semiconductor memory device as claimed in claim 4, wherein each of the N number of the unit precharge units includes four, eight or sixteen unit precharge units when a data width is ×4, ×8 or ×16, respectively.

6. The semiconductor memory device as claimed in claim 1, further comprising:
   an amplifier unit, which is enabled after the predetermined data buses are precharged to receive the N number of the data groups from the array and then transmit the N number of the received data groups to the plurality of the data buses; and
   a latch unit for sequentially receiving and latching the one or more data groups that must be output to the outside, and the remaining data groups from the plurality of the data buses, and then outputting the data groups.

7. The semiconductor memory device as claimed in claim 6, wherein the plurality of the data buses is disposed between the amplifier unit and the latch unit.

8. The semiconductor memory device as claimed in claim 1, wherein if four data groups are prefetched in a 4-bit prefetch type from the array, the predetermined data buses transmit the one or more data groups, which must be output to the outside first, among the four data groups faster than the remaining data groups.

9. The semiconductor memory device as claimed in claim 1, wherein if eight data groups are prefetched in a 8-bit prefetch type from the array, the predetermined data buses transmit the one or more data groups, which must be output to the outside first, among the eight data groups faster than the remaining data groups.

10. A semiconductor memory device using a N-bit (where, N is a natural number) prefetch type, comprising:
    an array of memory cells;
    an amplifier unit that amplifies a N number of data groups that are prefetched in the N-bit prefetch type, which are received from the array;
    a plurality of data buses that receives the N number of the data groups from the amplifier unit in a parallel way;
    a latch unit that latches the N number of the data groups that are received from the plurality of the data buses; and
    a data bus controller for precharging predetermined data buses that receive one or more data groups, which must be output to the outside first, among the N number of the data groups in accordance with I/O sequence information of the N number of the predetermined data groups,
    wherein after the predetermined data buses are precharged, the one or more data groups that must be output to the outside first are received from the amplifier unit, and then transmitted to the outside faster by a given time than the remaining data groups.

11. The semiconductor memory device as claimed in claim 10, wherein the data bus controller precharges the predetermined data buses, which receive the one or more data groups that must be output to the outside first thing, with a ½ power supply voltage.

12. The semiconductor memory device as claimed in claim 10, wherein the data bus controller comprises:
- a precharge signal generating unit that generates a N number of data bus precharge signals using a column address for deciding an I/O sequence of the N number of the predetermined data groups and a precharge signal having a given pulse width; and
- a precharge unit that precharges the predetermined data buses with a ½ power supply voltage in response to one of the N number of the data bus precharge signals.

13. The semiconductor memory device as claimed in claim 12, wherein the precharge unit includes a N number of unit precharge units that precharges the predetermined data buses with the ½ power supply voltage in response to one of the N number of the data bus precharge signals.

14. The semiconductor memory device as claimed in claim 13, wherein each of the N number of the unit precharge units includes four, eight or sixteen unit precharge units when a data width is ×4, ×8 or ×16, respectively.

15. The semiconductor memory device as claimed in claim 10, wherein the plurality of the data buses is disposed between the amplifier unit and the latch unit.

16. The semiconductor memory device as claimed in claim 10, wherein if four data groups are prefetched in a 4-bit prefetch type from the array, the predetermined data buses transmit the one or more data groups, which must be output to the outside first, among the four data groups faster than the remaining data groups.

17. The semiconductor memory device as claimed in claim 10, wherein if eight data groups are prefetched in a 8-bit prefetch type from the array, the predetermined data buses transmit the one or more data groups, which must be output to the outside first, among the eight data groups faster than the remaining data groups.

18. A method of transmitting data of a semiconductor memory device including an array of memory cells, the method comprising:
- precharging predetermined data buses, which transmit one or more data groups that must be output to the outside first thing among a N number of data groups that are prefetched in a N-bit prefetch type, among a plurality of data buses that receives the N number of the data groups from the array and transmits the received data groups to the outside, in accordance with I/O sequence information of the N number of the predetermined data groups; and
- transmitting the one or more data groups that must be output to the outside first thing to the outside faster than the remaining data groups after the predetermined data buses are precharged.

19. The method as claimed in claim 18, wherein the precharging step includes precharging the predetermined data buses with a ½ power supply voltage by using the I/O sequence information of the N number of the predetermined data groups.

20. The method as claimed in claim 18, wherein the precharging step further comprises the step of generating a N number of data bus precharge signals for precharging the predetermined data buses by using a column address for deciding the I/O sequence of the N number of the predetermined data groups and a precharge signal having a predetermined pulse width.

21. The method as claimed in claim 20, wherein the precharging step includes precharging the predetermined data buses in response to at least one of the N number of the data bus precharge signals.

22. The method as claimed in claim 18, wherein the transmission step includes, if four data groups are prefetched in a 4-bit prefetch type from the array, allowing the predetermined data buses to transmit the one or more data groups, which must be output to the outside first, among the four data groups faster than the remaining data groups.

23. The method as claimed in claim 18, wherein the transmission step includes, if eight data groups are prefetched in a 8-bit prefetch type from the array, allowing the predetermined data buses to transmit the one or more data groups, which must be output to the outside first, among the eight data groups faster than the remaining data groups.

* * * * *